(12) United States Patent
Mori

(10) Patent No.: US 8,529,024 B2
(45) Date of Patent: Sep. 10, 2013

(54) PIEZOELECTRIC ELEMENT, LIQUID EJECTING HEAD, AND LIQUID EJECTING APPARATUS

(75) Inventor: Tomotaka Mori, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/270,447

(22) Filed: Oct. 11, 2011

(65) Prior Publication Data

US 2012/0092423 A1   Apr. 19, 2012

(30) Foreign Application Priority Data

Oct. 13, 2010  (JP) ................. 2010-230296

(51) Int. Cl.
  *B41J 2/045* (2006.01)
  *H01L 41/00* (2013.01)
  *H02N 2/00* (2006.01)
(52) U.S. Cl.
  USPC ............................................ 347/68; 310/311

(58) Field of Classification Search
  None
  See application file for complete search history.

(56) References Cited

U.S. PATENT DOCUMENTS

| 7,589,450 B2 * | 9/2009 | Takabe et al. ............ 310/311 |
| 2002/0008743 A1 | 1/2002 | Murai |
| 2009/0127981 A1 | 5/2009 | Koike et al. |

FOREIGN PATENT DOCUMENTS

| JP | 2001-274472 | 10/2001 |
| JP | 2007-173604 | 7/2007 |
| JP | 2009-123974 | 6/2009 |

* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric element comprising an electrode film and a piezoelectric layer provided above the electrode film. The electrode film is preferentially oriented with (111) surface and contains platinum as the main component. The electrode film has a rhombohedral system.

5 Claims, 8 Drawing Sheets

PIEZOELECTRIC ELEMENT, LIQUID EJECTING HEAD, AND LIQUID EJECTING APPARATUS

CROSS-REFERENCE TO RELATED APPLICATIONS

This application claims the benefit of priority to Japanese Patent Application No. 2010-230296 filed Oct. 13, 2010, the contents of which are hereby incorporated by reference in their entirety.

BACKGROUND

1. Technical Field

The present invention relates to a liquid ejecting head, a liquid ejecting apparatus, and a piezoelectric element.

2. Related Art

As a piezoelectric element that is used in an actuator device, there is an element that is implemented by disposing a piezoelectric material having an electromechanical transduction function, for example, a piezoelectric body layer made of a crystallized dielectric material between two electrodes of a first electrode and a second electrode. An actuator device equipped with a piezoelectric element is generally called an actuator device of a flexural vibration mode, and for example, is mounted and used in a liquid ejecting head or the like. As a typical liquid ejecting head, for example, there is an inkjet type recording head in which a portion of a pressure generation chamber that communicates with the opening of a nozzle discharging ink droplets is implemented by a vibration plate and the ink droplets in the pressure generation chamber are discharged from the opening of the nozzle under pressure by deforming the vibration plate with a piezoelectric element.

As the piezoelectric element of the inkjet type recording head, a piezoelectric element having a lower electrode having at least one of a first layer positioned at the uppermost layer and containing iridium (Ir) and a second layer positioned at the next layer and containing platinum (Pt) is known (for example, see JP-A-2001-274472).

The piezoelectric element disclosed in JP-A-2001-274472 acquires a stable piezoelectric property by stabilizing a predetermined degree of alignment and improving reproducibility of a piezoelectric thin film. However, it is required to achieve stability and a high piezoelectric property, that is, improve the amount of piezoelectric displacement, in the piezoelectric element.

The problem is generated in not only the piezoelectric element mounted in the liquid ejecting head, but piezoelectric elements mounted in other apparatuses in the same way.

SUMMARY

An advantage of some aspects of the present invention is to provide a liquid ejecting head using a piezoelectric element having a higher piezoelectric property, a liquid ejecting apparatus, and a piezoelectric element having a higher piezoelectric property.

A liquid ejecting head of according to an aspect of the present invention includes a piezoelectric element in which a piezoelectric layer is disposed between a first electrode film and a second electrode film, and the first electrode film is aligned in prior on a (111) surface containing platinum as the main component and has a crystalline structure of rhombohedral system. The first electrode film having the crystalline structure of rhombohedral system has high crystalline property, such that conductivity is high and a loss of voltage is low, and accordingly, the piezoelectrid property of the piezoelectric element is improved. Therefore, a liquid ejecting characteristic of the liquid ejecting head is improved.

It is preferable that the first electrode film have a crystal surface gap of 2.242 to 2.262 Å in the (111) surface of the first electrode film. Further, the crystal surface gap of the present invention is the average value of the crystal surface gaps of the crystals in the first electrode film.

It is preferable that the piezoelectric body layer have a perovskite structure of which the general expression is $ABO_3$. As the piezoelectric layer is formed on the first electrode film having a high crystalline property, the crystalline property of the piezoelectric body layer can be improved and the piezoelectric property of the piezoelectric element can be improved.

It is preferable that a film containing iridium (Ir) as the main component is formed between the first electrode film and the piezoelectric body layer. As the film containing iridium (Ir) as the main component is formed, the piezoelectric body layer can be easily aligned by the (100) surface with a good crystalline property and it is possible to achieve a piezoelectric element having a preferable piezoelectric property.

A liquid ejecting apparatus of according to another aspect of the present invention includes the liquid ejecting heads described above. Since the liquid ejecting apparatus has the liquid ejecting head having the piezoelectric element having the high piezoelectric property, the liquid ejecting apparatus of the aspect of the present invention has high liquid ejecting characteristic.

In a piezoelectric element according to still another aspect of the present invention, a piezoelectric layer is disposed between a first electrode film and a second electrode film, and the first electrode film is aligned in prior on a (111) surface containing platinum as the main component and has a crystalline structure of a rhombohedral system. Since the first electrode film having the crystalline structure of rhombohedral system has a high crystalline property, conductivity is high and a loss of voltage is low. Therefore, the piezoelectric element of the aspect of the present invention has an improved piezoelectric property.

BRIEF DESCRIPTION OF THE DRAWINGS

The invention will be described with reference to the accompanying drawings, wherein like numbers reference like elements.

DESCRIPTION OF EXEMPLARY EMBODIMENTS

The invention is described hereafter in detail on the basis of embodiments.

Figure 1:
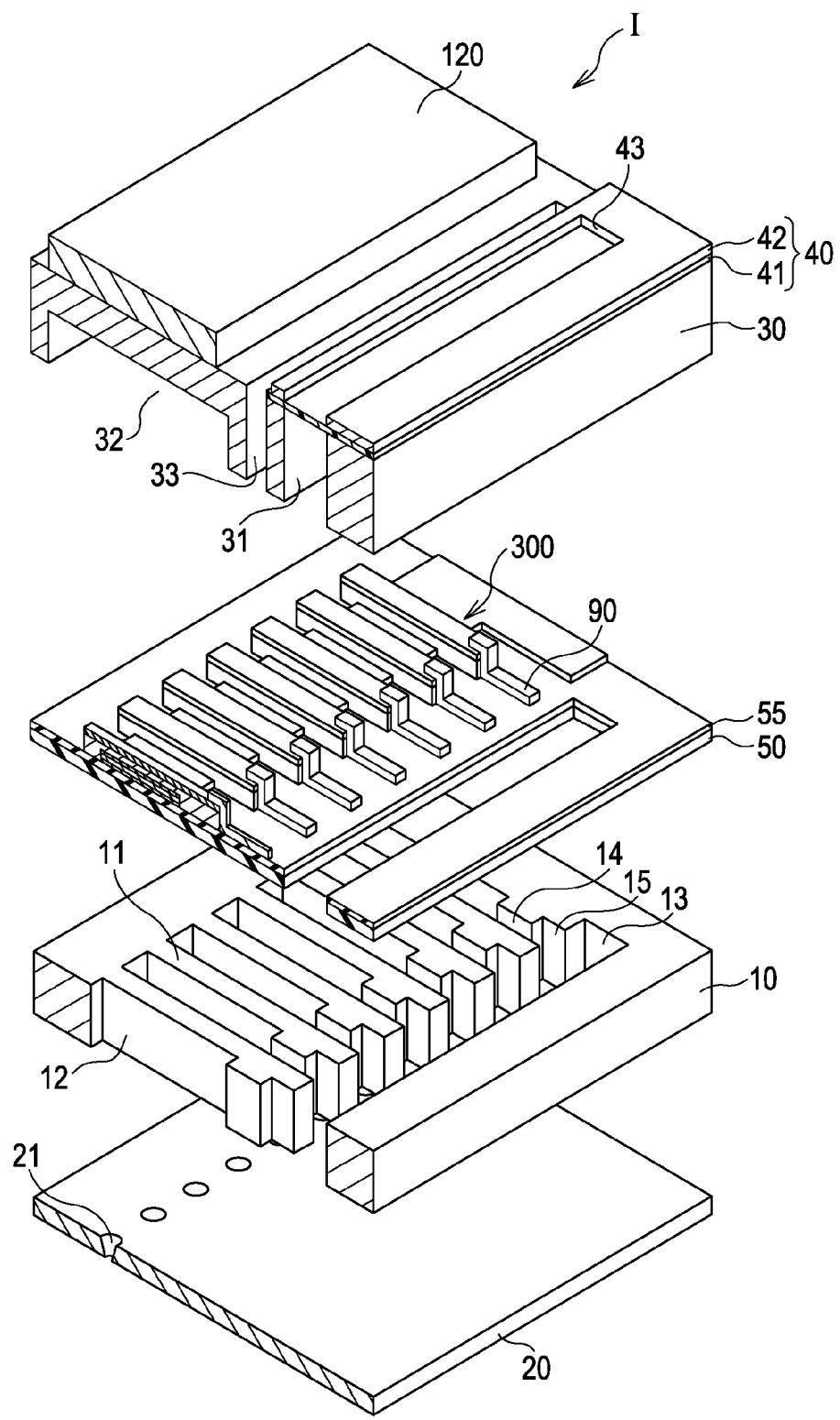
FIG. 1 is an exploded perspective view showing a schematic configuration of a recording head according to a first embodiment.
Figure 2A:
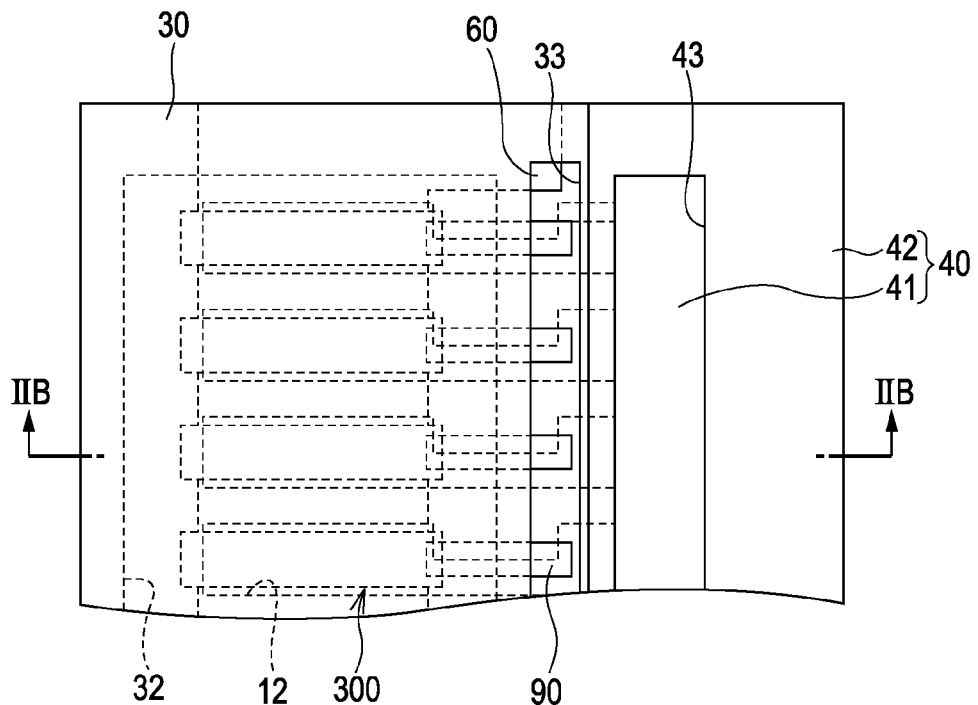
FIGS. 2A and 2B are a plan view and a cross-sectional view of the recording head according to the first embodiment.
Figure 2B:
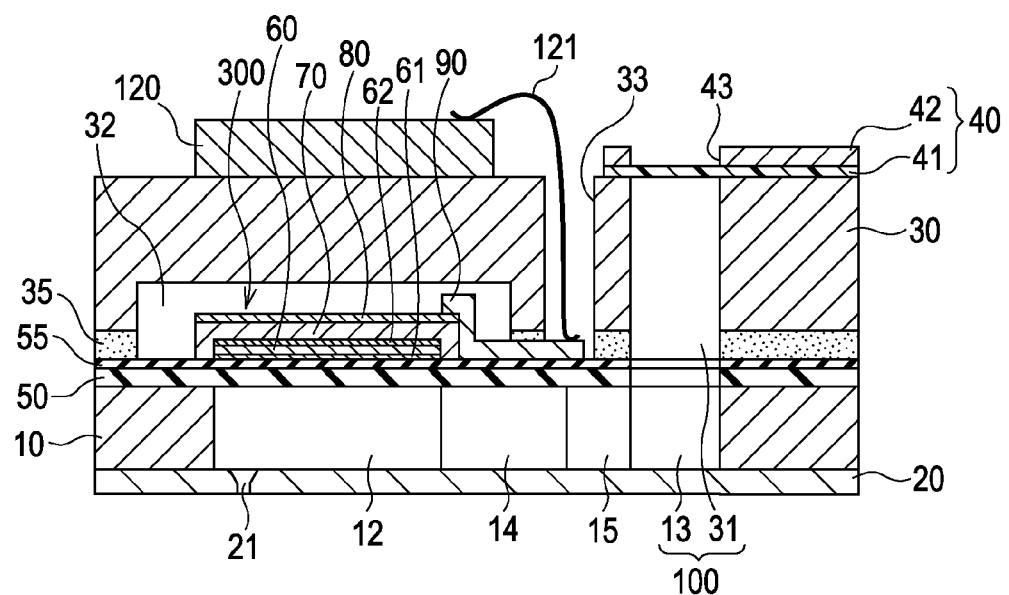

FIG. 1 is an exploded perspective view of an inkjet type recording head that is an example of a liquid ejecting head according to an embodiment of the present invention and FIGS. 2A and 2B are a plan view of FIG. 1 and a cross-sectional view taken along the line IIB-IIB. In a channel forming substrate 10 of an inkjet type recording head I, the crystal plane alignment of the surface is implemented by a silicon monocrystal substrate of a (110) surface and an elastic film 50 formed of an oxide film is formed on one surface.

Pressure generation chambers 12 divided by a plurality of separation walls 11 are formed in parallel in the width direction (transverse direction) by anisotropic etching from the other surface, in the channel forming substrate 10. Further, an ink supply channel 14 and a communicating channel 15 are divided by the separation walls 11 at one longitudinal end of each of the pressure generation chamber 12 of the channel forming substrate 10. Further, a communicating portion 13 of a reservoir 100 that is a common ink chamber (liquid chamber) of the pressure generation chambers 12 is formed at one end of the communicating channel 15.

The ink supply channel 14 communicates with one longitudinal end of the pressure generation chamber 12 and has a cross-sectional area smaller than the pressure generation chamber 12. For example, in the embodiment, the ink supply channel 14 is formed in a width smaller than the width of the pressure generation chamber 12 by narrowing the channel at the pressure generation chamber 12 between the reservoir 100 and the pressure generation chamber 12 and keeps the channel resistance of the ink flowing into the pressure generation chamber 12 from the communicating portion 13 constant.

That is, a liquid channel including the pressure generation chamber 12, the ink supply channel 14 having the cross-sectional area smaller than the transverse cross-sectional area of the pressure generation chamber 12, and the communicating channel 15 communicating with the ink supply channel 14 and having a cross-sectional area larger than the transverse cross-sectional area of the ink supply channel 14 is divided by the plurality of separation walls 11.

A nozzle plate 20 having a nozzle holes 21 bored to communicate with portions adjacent to the ends of the opposite sides to the ink supply channels 14 of the pressure generation chambers 12 are fixed to the open side of the channel forming substrate 10 by an adhesive or a thermal deposited film. Further, the nozzle plate 20 is made of, for example, glass ceramics, silicon monocrystal substrate, or stainless steel.

Meanwhile, an elastic film 50 having a thickness of about 1.0 μm, for example, as described above, is formed on the opposite surface of the nozzle plate 20 of the channel forming substrate 10 and an insulator film 55 having a thickness of about 0.4 μm, for example, is formed on the elastic film 50.

Further, a first electrode film 60 having a thickness of about 0.2 μm, for example, a piezoelectric body layer 70 having a thickness of about 1.0 μm, for example, and a second electrode film 80 having a thickness of about 0.05 μm are stacked on the insulator film 55 in the process described below. An adherence layer 61 for increasing adhesion between the insulator film 55 and the first electrode film 60 is disposed between the insulator film 55 and the first electrode film 60 while an anti-dispersion layer 62 for preventing dispersion of metal between layers is disposed between the first electrode film 60 and the piezoelectric body layer 70. The piezoelectric element 300 includes at least the first electrode film 60, the piezoelectric layer 70, and the second electrode film 80 and further includes the anti-dispersion layer 62 in the embodiment.

The first electrode film 60 is a conductive film containing platinum as a main component and is oriented in priority on the (111) surface. The prior alignment implies a state in which the alignment direction of crystals is not disordered and specific crystal planes are aligned in a substantially predetermined direction. Further, the main component is a metal element having the highest strength, which is detected from the films, and the state of the main component contained in the films is not specifically limited and may be a single metal state, an alloy state, a metal compound state, a metal oxide state, or other compound states.

Platinum generally has a face-centered cubic system, whereas, as described, the first electrode film 60 that is preferentially aligned on the (111) surface has a rhombohedral system. This is because the first electrode film 60 contracts in the thickness direction in the embodiment, and accordingly, it has the rhombohedral system that contracts in the (111) face direction due to the contraction, whereas platinum generally has a face-centered cubic system. That is, it contracts such that the inter-crystal gap (hereafter, briefly referred to as a (111) surface gap) on the (111) surface in the film thickness direction of the first electrode film 60 is 2.262 Å or less shorter than the (111) surface gap 2.27 Å of a bulk of platinum. Due to the contraction, the first electrode film 60 of the embodiment decreases in operable region in the (111) direction, such that the crystalline property is higher than platinum of which the crystalline structure is the face-centered cube. As the crystalline property of the first electrode film 60 is improved, the conductivity of the first electrode film 60 is improved, such that It is possible to reduce a loss of voltage.

The piezoelectric body layer 70 is formed by growing the crystals of a piezoelectric material on the first electrode film 60, as described below, such that it is possible to improve the crystalline property of the piezoelectric body layer 70 by increasing the crystalline property of the first electrode film 60. Therefore, it is possible to improve the piezoelectric property of the piezoelectric element 300 by forming the first electrode film 60 having a high crystalline property. Further, the (111) face gap of the first electrode film 60 is preferably 2.242 Å or more. This is because distortion becomes 1% or more and cracks are easily developed, when it is under 2.242 Å. Further, as described above, since the inter-crystal gap in the (111) surface in the film thickness direction of the first electrode film 60 is 2.262 Å or less, the crystalline property is more improved.

The adhesion layer 61 may contain as the main component at least one element selected from a group of titanium (Ti) having a thickness of 5 to 20 nm, chromium (Cr), tantalum (Ta), zirconium (Zr), and tungsten (W), and in which any one of Ti and Zr is preferable. A titanium (Ti) film having a thickness of 20 nm is disposed as the adhesion layer 61 in the embodiment. As described above, as the adhesion layer 61 is disposed between the first electrode film 60 and the insulator film 55, the adhesion force between the insulator film 55 and the first electrode 60 can be increased.

The anti-dispersion layer 62 is provided to prevent the components of the adhesion layer 61 from dispersing into the piezoelectric layer 70 and prevent the components of the piezoelectric layer 70 from dispersing into the first electrode film 60, when forming the piezoelectric body layer 70 through crystallization by burning it. The anti-dispersion layer 62 may contain as the main component at least on element selected from a group of iridium (Ir), palladium (Pb), rhodium (Rh), ruthenium (Ru), and osmium (Os), having a thickness of 10 to 50 nm. A iridium oxide film containing iridium as the main component (for example, a $IrO_2$ film having a thickness of 20 nm) is used as the anti-dispersion layer 62. As a iridium oxide film containing iridium as the main components, such as $IrO_2$, the piezoelectric body layer 70 is easily aligned with a high crystalline property on the (100) surface, in which it is possible to achieve a higher piezoelectric property.

The piezoelectric layer 70 is made of lead zirconate titanate (PZT) that is aligned in prior in the (100) surface. In the embodiment, the piezoelectric body 70 is formed on the anti-dispersion layer 62 made of iridium oxide on the first electrode film 60 having a high crystalline property, such that the crystalline property is high and the piezoelectric property is excellent. Further, although the piezoelectric body layer 70 is aligned in prior on the (100) surface in the embodiment, it may be aligned in prior on the (111) surface.

The piezoelectric layer 70 is not limited to lead zirconate titanate (PZT) and may have a perovskite type of which the general expression is $ABO_3$. For example, a substance made by adding metal, such as niobium, nickel, or magnesium, into lead zirconate titanate (PZT) or lean lanthanum zirconate titanate ((Pb, La)(Zr, Ti)$O_3$) or lead magnesium niobate zirconate titanate (Pb(Zr, Ti)(Mg, Nb)$O_3$) may be used. Further, tungsten (W), sodium (Na), potassium (K), tantalum (Ta), and strontium (Sr) may be added. Further, it is preferable that the piezoelectric body layer 70 contain lead, zirconium, and titanium. The piezoelectric body layer 70 of the embodiment is driven as an appropriate electromechanical transducing element by containing them.

A lead electrode 90 made of gold (Au) or the like which extends from the periphery of the end of the ink supply channel 14 of the channel forming substrate 10 to the insulator film 55 is connected to the second electrode film 80 of the piezoelectric element 300. A voltage is selectively applied to the piezoelectric element 300 through the lead electrode 90 and the piezoelectric element 300 is displaced. The assembly of the piezoelectric element 300 and the vibration plate that is displaced by driving the piezoelectric element 300 is an actuator apparatus. Further, the elastic film 50 or the insulator film 55 is not formed on the channel forming substrate 10, but the first electrode film 60 may be directly formed. The lead electrode 90 is exposed to a through-hole 33 formed at a protection substrate 30.

The protection substrate 30 is bonded to the surface of the channel forming substrate 10 which faces the piezoelectric element 300 through an adhesive layer, such as an adhesive. A reservoir portion 31 that communicates with the communicating portion 13 in an area opposite to the communicating portion 13 of the reservoir 100 to be a common ink chamber of the pressure generation chambers 12 is formed at the protection substrate 30.

A piezoelectric element protection portion 32 for protecting the piezoelectric element 300 is formed in an area opposite to the piezoelectric element 300, in the protection substrate 30. Further, the piezoelectric element protection portion 32 may have a space that does not interfere with the motion of the piezoelectric element 300 and the space may be sealed or not.

Although the reservoir 100 is composed of the communicating portion 13 of the channel forming substrate 10 and the reservoir portion 31 of the protection substrate 30, if not specifically stated, for example, the communicating portion 13 of the channel forming substrate 10 may be divided for each of the pressure generation chambers 12 and only the reservoir portion 31 may be considered as the reservoir. Further, for example, only the pressure generation chambers 12 is formed at the channel forming substrate 10 while a reservoir and ink supply channels that communicate with the power generation chambers 12 may be formed at a member (for example, the elastic film 50 or the insulator film 55) that is interposed between the channel forming substrate 10 and the protection substrate 30.

A driving circuit 120 that drives the piezoelectric element 300 is mounted on the protection substrate 30. A circuit board or a semiconductor integrated circuit (IC) may be used as the driving circuit 120. Further, the driving circuit 120 and the lead electrode 90 are electrically connected through a connecting wire 121 formed of a conductive wire, such as a bonding wire.

A compliance substrate 40 composed of a sealing film 41 and a fixing plate 42 is bonded on the protection substrate 30. In this configuration, the sealing film 41 is made of a material having flexibility with low rigidity and one surface of the reservoir portion 31 is sealed by the sealing film 41. Further, the fixing plate 42 is made of a hard material, such as metal. The area of the fixing plate 42 which is opposite to the reservoir 100 is an opening 43 completely removed in the thickness direction, such that one surface of the reservoir 100 is sealed only by the sealing film 41 having flexibility.

In the inkjet type recording head I of the embodiment, ink is acquired from an external ink supply unit, the inside from the reservoir 100 to the nozzle holes 21 is filled with the ink, and the elastic film 50, the insulator film 55, the first electrode film 60, and the piezoelectric body layer 70 are bent by driving the piezoelectric element 300 in accordance with a driving signal from the driving circuit 120, such that the internal pressure of the pressure generation chambers 12 increases and ink droplets are discharged from the nozzle holes 21.

Manufacturing Method

A manufacturing method of an inkjet type recording head of the embodiment is described herein with reference FIGS. 3A to 6. FIGS. 3A to 6 are cross-sectional views showing the main parts to illustrate a manufacturing method of an inkjet type recording head of the embodiment.

Figure 3A:
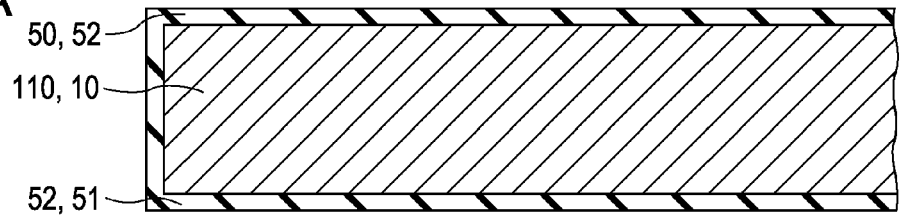
FIGS. 3A to 3D are cross-sectional views illustrating a method of manufacturing the recording head according to the first embodiment.

As shown in FIG. 3A, a wafer 110 for a channel forming substrate, which is a silicon wafer, is thermally oxidized in a diffusion furnace at 1100° C. and a silicon dioxide film 52 of the elastic film 50 is formed on the surface.

Figure 3B:
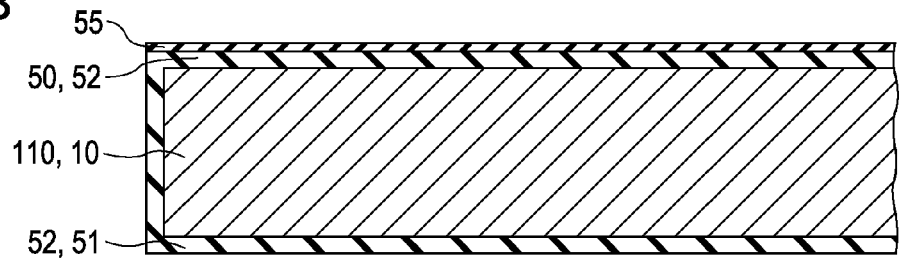

Next, as shown in FIG. 3B, the insulator film 55 made of an zirconium oxide is formed on the elastic film 50 (silicon dioxide film 52). In detail, a zirconium (Zr) film formed on the elastic film 50 (silicon dioxide film 52), for example, by sputtering, and then the insulator film 55 made of zirconium oxide ($ZrO_2$) is formed by, for example, thermally oxidizing the zirconium layer.

Figure 3C:
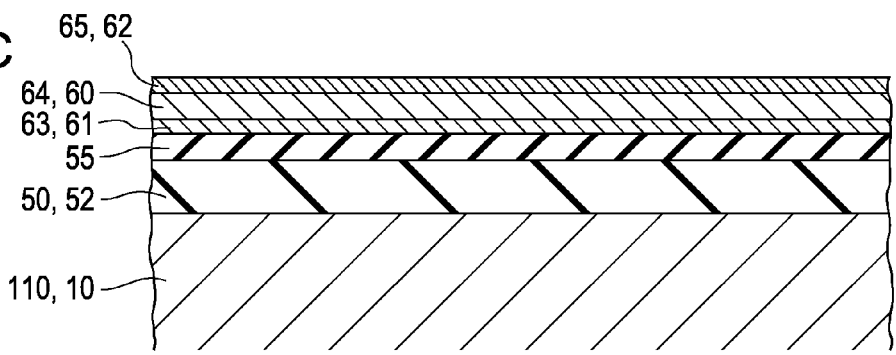

Next, as shown in FIG. 3C, an adhesion layer forming film 63, a platinum film 64 and an anti-dispersion layer forming film 65 is sequentially formed. In detail, the adhesion layer forming film 63 is formed first on the insulator film 55. A film is made of Ti, for example, by DC magnetron sputtering, as the adhesion layer forming film 63. The adhesion layer forming film 63 becomes the adhesion layer 61 by heating in the following process.

Next, the platinum film 63 made of platinum (Pt) is formed on the adhesion layer forming film 63 to have a thickness of 50 to 500 nm. The platinum film 64 is formed to have a thickness of 130 nm in the embodiment. The platinum film 64 described above can be formed, for example, by DC magnetron sputtering apparatus. In the embodiment, the platinum may have a rhombohedral system by contracting the platinum film 64 in the thickness direction by a heating process after the platinum film 64 is formed, such that it is possible to achieve the first electrode film 60 having a desired high crystalline property.

Further, it is possible to increase the crystalline property of the films formed on the first electrode film 60 by performing the following processes after the first electrode film 60 having a high crystalline property is formed by the heating process after the platinum film 64 is formed. That is, when the first electrode film is formed by contracting the platinum film by heating in a drying process or a degreasing process of a piezoelectric precursor film without performing the heating process as in the embodiment, the piezoelectric film is started to be crystallized before excellent crystallization is implemented, such that a difference of alignment may be generated in crystal growth of the piezoelectric body film. Therefore, as in the embodiment, it is preferable to form the first electrode film 60 having a desired high crystalline property by performing the heating process before forming the piezoelectric body film 72.

In the heating process, the heating may be formed at 300° C. or more and less than 450° C., for example, by using a hot plate or an RTP apparatus. It is possible to achieve a first electrode film 60 of which the crystalline structure is a rhombohedral system by heating at 300° C. or more. Further, when heating is performed at 450° C. or more, thermal stress increases and the substrate may warp, which is not preferable.

Although the desired first electrode film 60 is achieved by the heating process after being formed by sputtering in the embodiment, the desired first electrode film 60 may also be achieved by appropriately adjusting a film-forming rate, a inter-target substrate distance, a film-forming pressure, and the flow rate of argon when forming the film. For example, it is possible to make the crystalline structure of the formed first electrode film 60 in the rhombohedral system by making the film-forming pressure high and making the pressure of the argon gas high when forming the first electrode film 60. Further, the grid constant or the crystal grain size of the adhesion layer 61 that is achieved by the adhesion layer forming film 63 that is the foundation layer of the first electrode film 60 may be controlled. However, it is possible to achieve the desired first electrode film 60 simply, easily, and efficiently by providing the separate heating process, as in the embodiment.

Further, the anti-dispersion layer forming film 65 is formed on the first electrode film 60. A film is made of Ir, for example, by DC magnetron sputtering, as the adhesion layer forming film 65. The film made of Ir is oxidized in the following process and becomes a $IrO_2$ film that is the anti-dispersion layer 62.

Figure 3D:
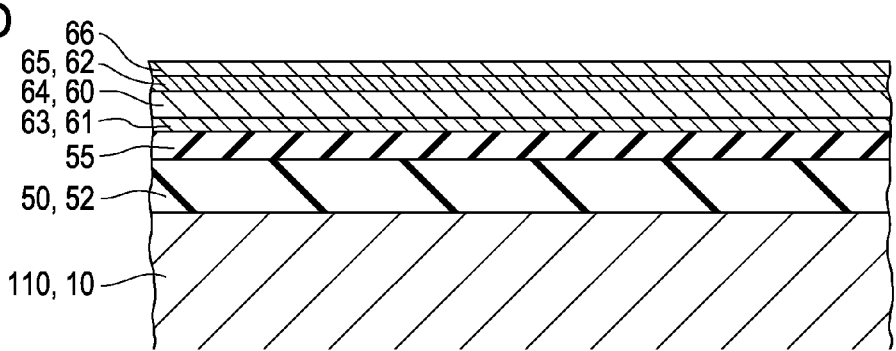

Next, as shown in FIG. 3D, the titanium layer 66 is made of titanium (Ti) on the first electrode film 60 to have a thickness of 1 to 20 nm, a thickness of 4 nm in the embodiment. Although the detail is described below, the first electrode film 60 and the piezoelectric body film 72 at the first layer are simultaneously patterned such that sides incline, in the process of forming the first layer of the piezoelectric body film 72 after forming the titanium layer 66 on the first electrode film 60.

As the titanium layer 66 is formed on the first electrode film 60, it is possible to control the prior alignment orientation of the piezoelectric body layer 70 to the (100) when forming the piezoelectric body layer 70 on the first electrode film 60 through the titanium layer 66 in the following process, such that it is possible to achieve an appropriate piezoelectric layer 70 as an electromechanical transducing element. Further, the titanium layer 66 functions as a seed that promotes crystallization when the piezoelectric body layer 70 is crystallized and is dispersed in the piezoelectric body layer 70 when the piezoelectric precursor film 71 is burned.

The piezoelectric body layer 70 made of lead zirconate titanate (PZT) is formed. In the embodiment, the piezoelectric body layer 70 made of a metal oxide is achieved by dissolving and diffusing an organic metal material in a catalyst, applying a so-called solgel for drying, and burning it at a higher temperature, that is, the piezoelectric body layer 70 is formed by using a so-called solgel method. The manufacturing method of the piezoelectric body layer 70 is not limited to the solgel method, and for example, MOD (Metal-Organic Decomposition) may be used.

Figure 4A:
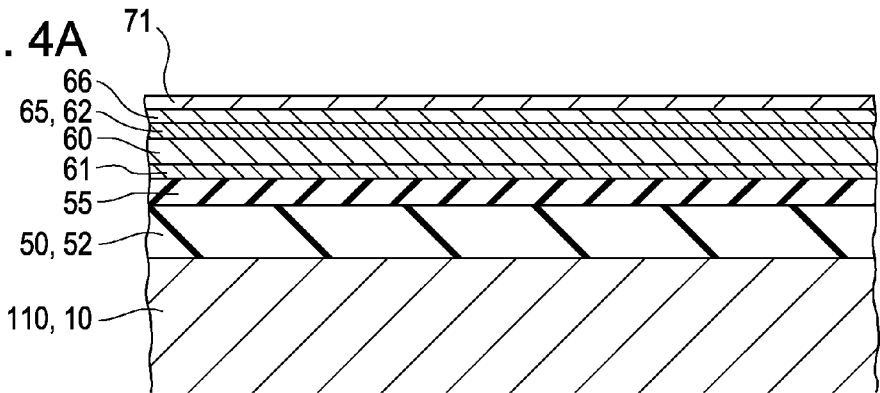
FIGS. 4A to 4D are cross-sectional views illustrating a method of manufacturing the recording head according to the first embodiment.

According to the detailed order of forming the piezoelectric body layer 70, first, as shown in FIG. 4A, the piezoelectric precursor film 71 that is a PZT precursor film is formed on the titanium layer 66 before patterning. That is, a solgel (solution) containing a metallic organic compound is applied onto the channel forming substrate 10 where the first electrode film 60 is formed (applying process). Next, the piezoelectric precursor film 71 is dried for a predetermined time while being heated at a predetermined temperature (drying process). For example, in the embodiment, the drying is possible by holding the piezoelectric precursor film 71 for 8 to 30 minutes at 100 to 250° C.

Degreasing is performed by heating and holding the dried piezoelectric precursor film 71 at a predetermined temperature for a predetermined time. For example, in the embodiment, the degreasing is performed by heating the piezoelectric precursor film 71 at 300 to 400° C. and holding it for about 10 to 30 minutes. Further, the degreasing described herein is to remove organic components contained in the piezoelectric precursor film 71 as, for example, $NO_2$, $CO_2$, $H_2O$ or the like.

Figure 4B:
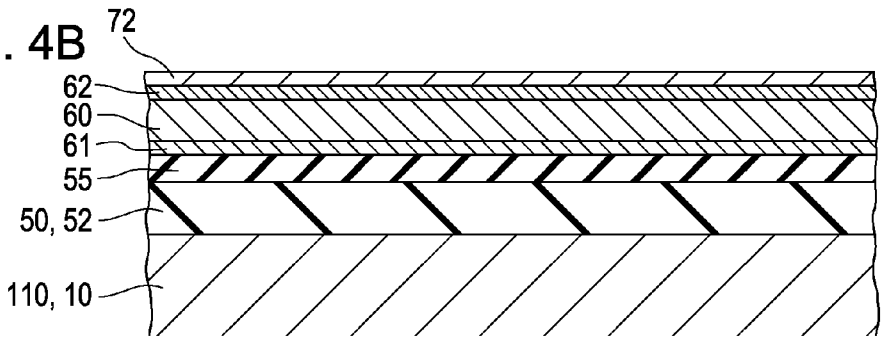

Next, as shown in FIG. 4B, crystallization is performed by heating and holding the piezoelectric precursor film 71 at a predetermined temperature for a predetermined time, such that the piezoelectric body film 72 is formed (burning process). In the burning process, it is preferable to heat the piezoelectric precursor film 71 at 680 to 900° C., and the piezoelectric body film 72 was formed by burning the piezoelectric precursor film 71 by performing heating at 680° C. for 5 to 30 minutes in the embodiment. Although the method of heating the piezoelectric body film 72 in the burning process is not specifically limited, it is preferable to make the temperature rising rate relatively high by using, for example, an RTA (Rapid Thermal Annealing) method. For example, in the embodiment, the piezoelectric body film was heated at a relative high temperature rising rate, using an RTP (Rapid Thermal Processing) apparatus that performs heating by radiating infrared light.

Further, for example a hot plate or an RTA apparatus may be used as a heating apparatus using a drying process and a degreasing process.

Figure 4C:
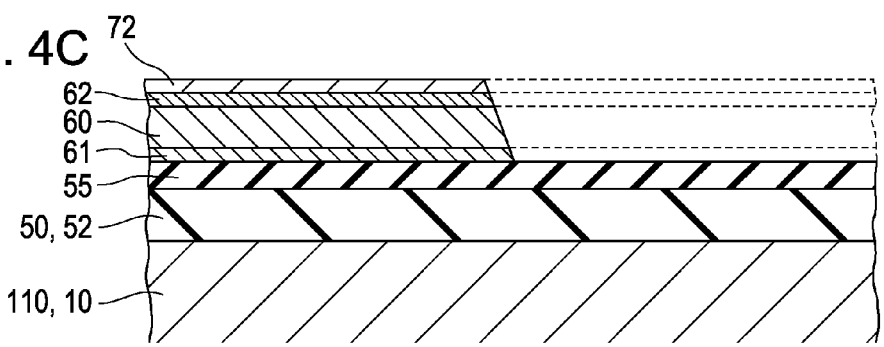

Further, as shown in FIG. 4C, when the piezoelectric body film 72 that is the first layer is formed on the first electrode film 60, the first electrode film 60 and the piezoelectric body film 72 that is the first layer are simultaneously patterned such that the sides incline.

Figure 4D:
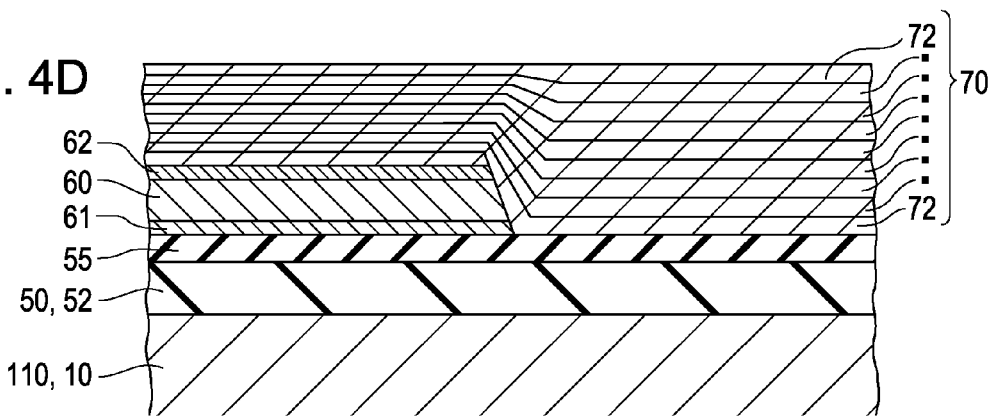

Further, the piezoelectric body layer 70 having a predetermined thickness which is composed of a plurality layers of piezoelectric body film 72 is formed, as shown in FIG. 4D, by repeating several times the piezoelectric body film forming process composed of the applying process, the drying process, the degreasing process, and the burning process, which are described above, after the patterning. For example, when the film thickness per solgel is 0.1 μm, the entire film thickness of the piezoelectric body layer 70 composed of ten layers of piezoelectric body films 72 is about 1.1 μm. In the embodiment, since the piezoelectric body layer 70 is formed on the first electrode film 60 having a high crystalline property achieved by the heating process after the platinum film 64 is formed, the crystalline property of the piezoelectric layer 70 is improved.

As described above, since the sides of the first electrode film 60 and the piezoelectric body film 72 that is the first layer are inclined by simultaneously performing the piezoelectric body film 72 that is the first layer when it is formed, as described above, it is possible to improve throwing power when forming the piezoelectric precursor films 71 that are the second and the next layers. Therefore, it is possible to form the piezoelectric body layer 70 having excellent adhesion and reliability.

Figure 5A:
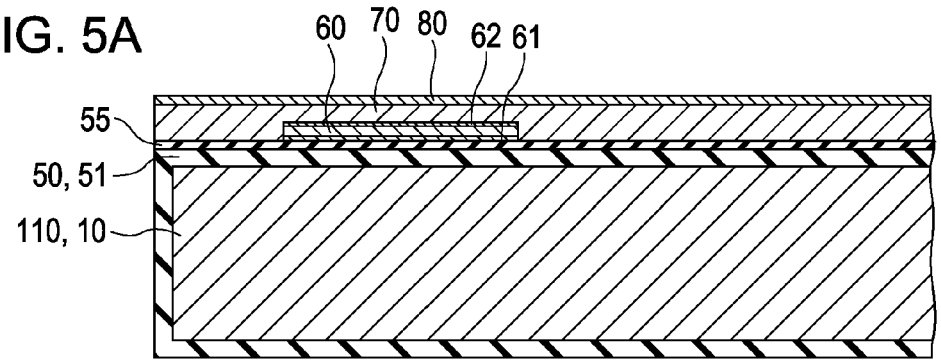
FIGS. 5A to 5C are cross-sectional views illustrating a method of manufacturing the recording head according to the first embodiment.
Figure 5B:
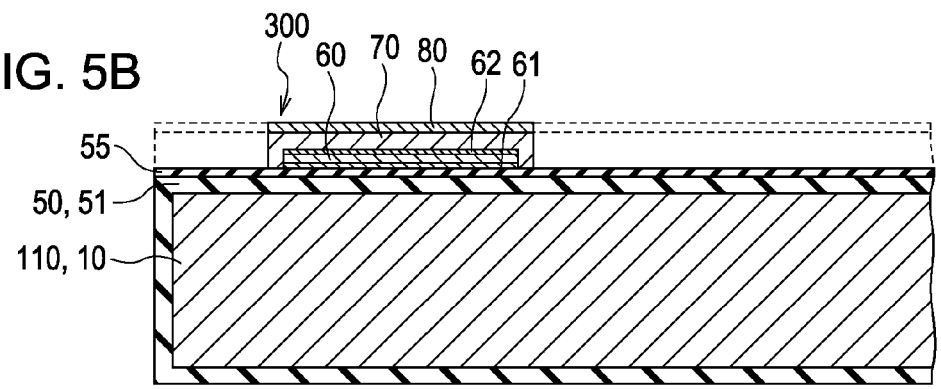
Figure 5C:
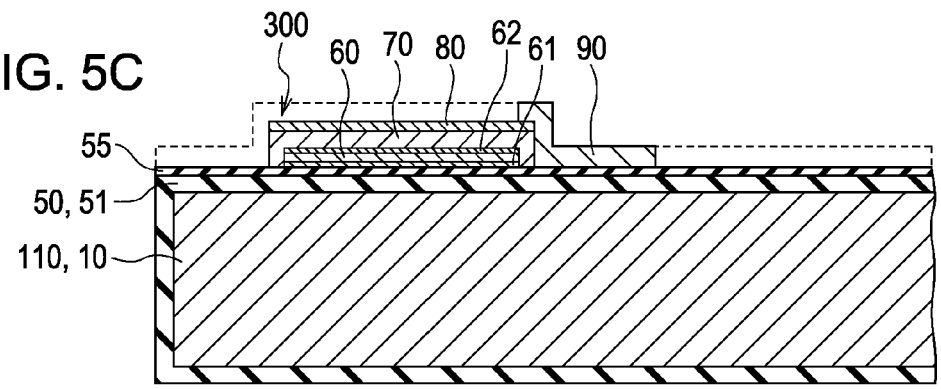

Further, after the piezoelectric body layer 70 is formed by the processes shown in FIGS. 4A to 4D, as shown in FIG. 5A, a second electrode film 80, for example, which is made of iridium (Ir), is formed throughout the surface of the water 110 for a channel forming substrate. Next, as shown in FIG. 5B, a piezoelectric element 30 is formed by patterning the piezoelectric body layer 70 and the second electrode film 80 onto the areas opposite to the pressure generation chambers 12. Next, a lead electrode 90 is formed. In detail, as shown in FIG. 5C, it is formed by patterning the piezoelectric elements 30 through a mask pattern (not shown), for example, which is implemented by a resistor or the like, after forming the lead electrode 90, for example, which is made of platinum (Au) throughout the water 110 for a channel forming substrate.

Figure 6A:
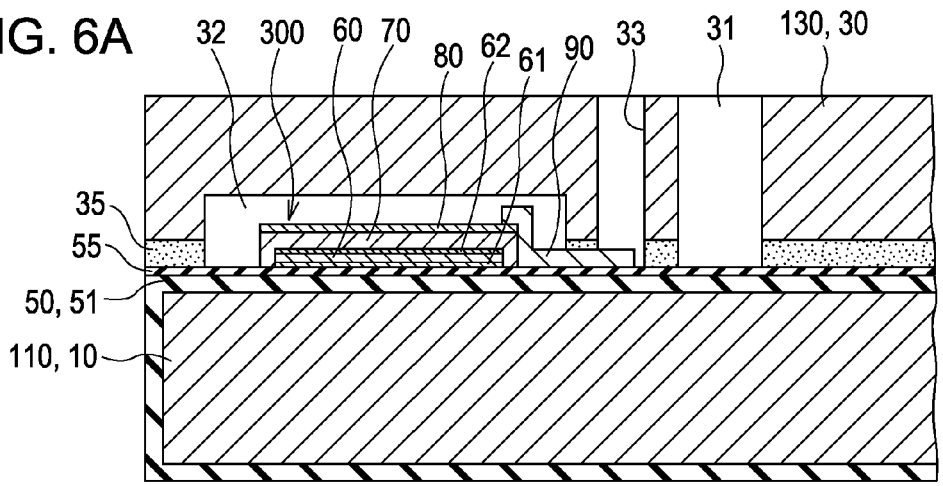
FIGS. 6A to 6C are cross-sectional views illustrating a method of manufacturing the recording head according to the first embodiment.
Figure 6B:
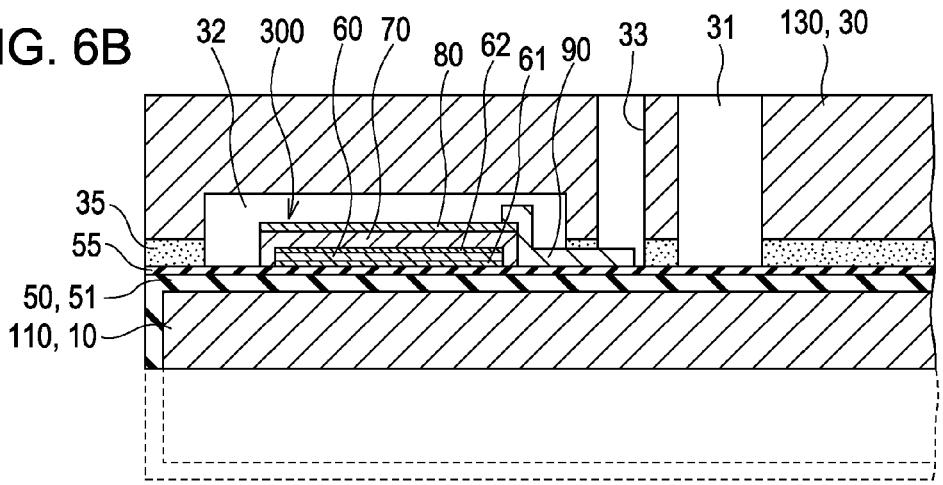
Figure 6C:
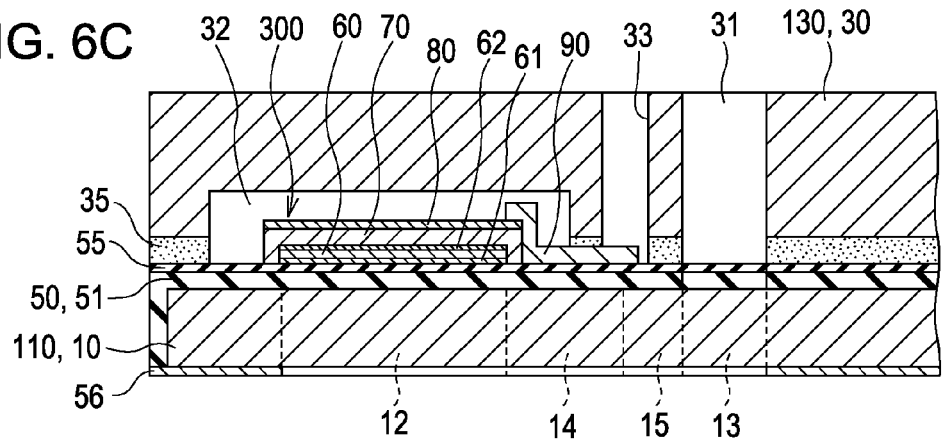

Thereafter, as shown in FIG. 6A, a wafer 130 for protection substrate where the reservoir portion 31 and the piezoelectric element protection portion 32 are formed in advance is bonded onto the water 110 for a channel forming substrate after the film forming process is finished, by an adhesive 35. Next, as shown in FIG. 6B, the water 110 for a channel forming substrate is made with a desired thickness, and then, as shown in FIG. 6C, a mask 56 is formed and the pressure generation chambers 12, the communicating portions 13, the ink supply channels 14, and the communicating channels 15 are formed by performing anisotropic etching on the water 110 for a channel forming substrate that is a monocrystal silicon substrate.

Thereafter, although the process is not specifically shown, unnecessary portions of the outer circumferential edges of the water 110 for a channel forming substrate and the wafer 130 for protection substrate is cut and removed, for example, by dicing. Further, a nozzle plate 20 with the nozzle holes 21 is bonded to the opposite side of the wafer 130 for protection substrate of the water 110 for a channel forming substrate and the compliance substrate 40 is bonded to the wafer 130 for protection substrate, and then the water 110 for a channel forming substrate is divided into the channel forming substrate 10 of one tip size shown in FIG. 1, such that the inkjet type recording head of the embodiment is implemented.

Hereinafter, the embodiment of the present invention is described by using examples.

Example 1 to 4

The elastic film 50 made of silicon dioxide $SiO_2$ is formed by thermally oxidizing the wafer for channel forming substrate formed of a silicon water and the insulator film 55 made of a zirconium oxide $ZrO_2$ is formed on the elastic film, by the same manufacturing method as the embodiment described above. Further, the adhesion layer forming film 63 made of titanium (Ti) to have a thickness of 20 nm and the platinum film 64 made of platinum (Pt) to have a thickness of 130 nm are sequentially stacked and the adhesion layer 61 and the first electrode film 60 are formed by performing a heating process for 5 minutes at the heating temperatures described in Table 1. Thereafter, the anti-dispersion layer forming film 65 is made of iridium (Ir) to have a thickness of 10 nm. Further, the titanium film 66 made of titanium (Ti) to have a thickness of 4 nm is formed on the anti-dispersion layer.

TABLE 1

| | Heating Temperature (° C.) |
|---|---|
| Example 1 | 300 |
| Example 2 | 330 |
| Example 3 | 360 |
| Example 4 | 400 |

In the achieved Examples 1 to 4, the half width of the (111) surface of the first electrode film 60 and the surface gap of the (111) surface was acquired by a wide angle measuring method by an X-ray diffractometer "X'pertProMPD (tube: CuKα wire, slit: DS1/2°, ASS1°, soller-slit 0.04 rad, and detector: monochrometer & PIXcel by Spectris Co., Ltd.). Further, variation reduction ratios were examined and variation of surface gap was estimated on the basis of the reduction ratios. Further, the reduction ratio are values expressed in percentage by half widths of the examples are derived from the half width of comparative data and dividing the derived values by the half width of the comparative example, and the larger the values, the more the variation is reduced, which shows that the result is good. The comparative data is data of a thin film having the same surface gap as platinum having general bulk cubic crystals. Further, the "half width" is the half of the width of peak strength corresponding to the crystal surfaces of X-ray diffraction θ/2θ measured by an X-ray diffraction wide angle method. Further, the half width and the variation of the surface gap are proportionate.

Figure 7:
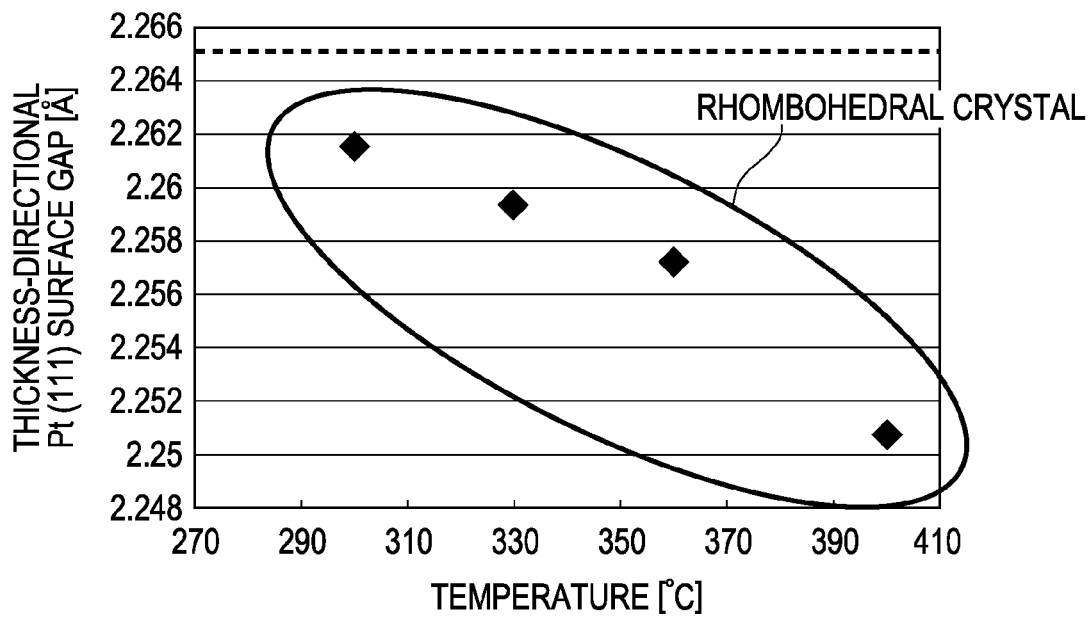
FIG. 7 is a graph showing a measurement result of an embodiment.
Figure 8:
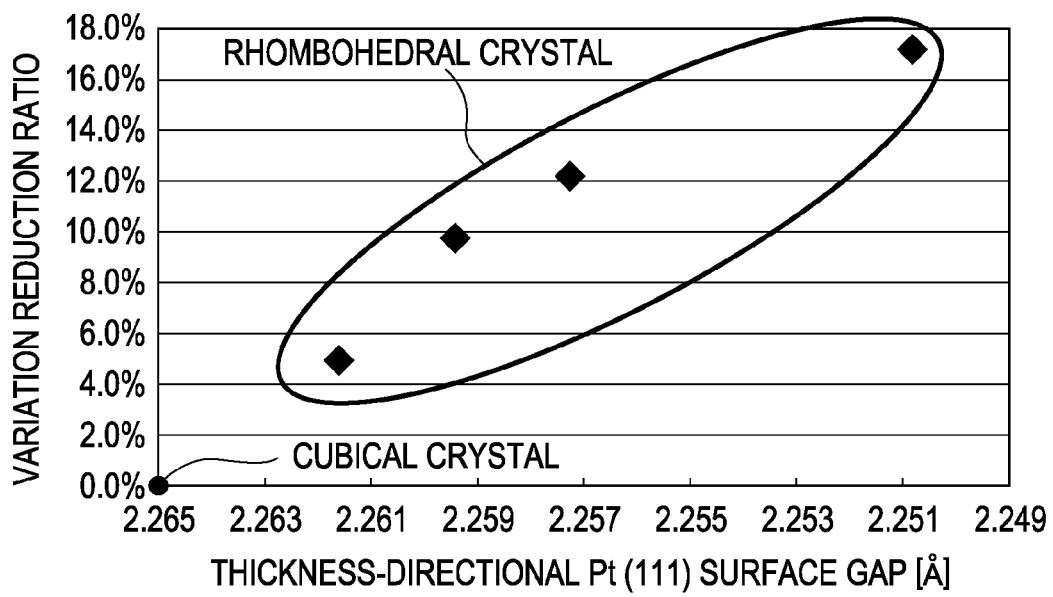
FIG. 8 is a graph showing a measurement result of an embodiment.

The result of (111) surface gap of the first electrode film 60 for the heating temperatures is shown in FIG. 7 and the variation reduction ratios for the (111) surface gap of the first electrode film 60 is shown in FIG. 8.

As shown in FIG. 7, in all of the examples, it was found that the surface gap is smaller than the grid constant of the (111) surface gap of the bulk cubic crystal described at the comparative data and a rhombohedral system is achieved. In detail, the (111) surface gap was 2.242 to 2.262 Å in all of the examples, and the higher the heating temperature, the more the surface gap decreases, such that the surface gag was about 2.251 Å at the heating temperature of 400° C. Further, as shown in FIG. 8, the (111) surface gap of the first electrode film 60 was decreased while the variation reduction ratios were improved. In particular, the variation reduction ratio was 17% at the temperature of 400° C., such that the variation of the crystals was considerably reduced. As described above, it was found that the variation in the crystalline structure was suppressed and the first electrode film 60 having a high crystalline property in a rhombohedral system by performing the heating process.

Therefore, according to Embodiments 1 to 4, it was found that it is possible to achieve the first electrode film 60 having the rhombohedral system, such that the crystalline variation is small and the crystalline property is high in the first electrode film 60, by making the temperature at 300° C. or more in the heating process. As described above, as the crystalline property of the first electrode film 60 increases, a loss of voltage is small and the crystalline property of the piezoelectric body layer is high. Therefore, the piezoelectric property of the piezoelectric element 300 is improved.

Figure 9:
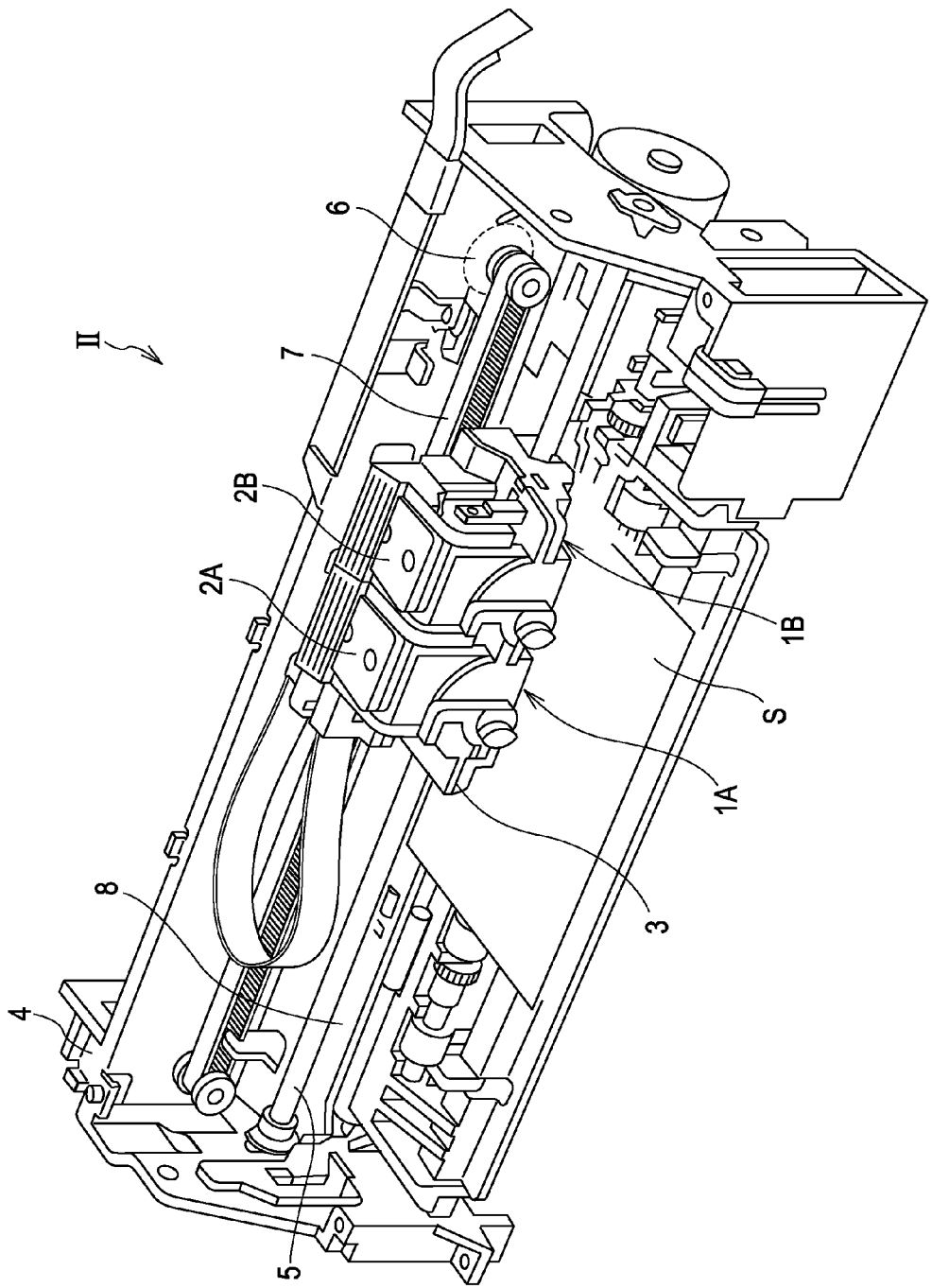
FIG. 9 is a schematic view showing an example of an inkjet type recording apparatus.

Further, the inkjet type recording head I of the embodiment constitutes a portion of a recording head unit having an ink channel that communicates with a ink cartridge or the like, and is mounted in an inkjet type recording apparatus II. FIG. 9 is a schematic view showing an example of the inkjet type recording apparatus.

As shown in FIG. 9, recording head units 1A and 1B each having an inkjet type recording head include cartridges 2A and 2B, respectively, of ink supply units which are detachably disposed, and a carriage 3 equipped with the recording head units 1A and 1B is disposed to be freely movable in the axial direction of a carriage shaft 5 mounted in the apparatus main body. The recording head units 1A and 1B discharge a black ink composition and a color ink composition, respectively.

Further, a driving force of a driving motor 6 is transmitted to the carriage 3 by a plurality of gears (not shown) and a timing belt 7, such that the carriage 3 equipped with the recording head units 1A and 1B moves along the carriage shaft 5. Meanwhile, a platen 8 is disposed along the carriage shaft 5 in the apparatus main body 4 and a recording sheet S, which is a recording medium, such as paper, supplied by paper-feeding rollers (not shown), is wound around the platen 8 and conveyed.

Other Examples

Although the embodiments of the present invention are described above, the basic configuration of the inkjet type recording head is not limited to the description. Although the heating process is performed after the platinum 64 is formed in the embodiments described above, the heating process may be performed before the piezoelectric body layer 70, that is, the piezoelectric precursor film 71 is applied, after the platinum film 64 is formed. For example, the anti-dispersion layer forming film 65 may be formed after the platinum 64 is formed, and then, the first electrode film 60 and the anti-dispersion layer 62 may be formed after the heating process is performed. In this case, the piezoelectric precursor film 71 can be formed on the anti-dispersion layer 62, of which the crystals are grown together with the first electrode film 60, such that the crystalline property of the piezoelectric body film 72 is increased.

Although the piezoelectric body film 72 is formed by being burned after the piezoelectric precursor film 71 is applied, dried and decreased in the embodiments described above, this is not specifically limited, and the piezoelectric body film 72 may be formed by being burned, for example, repeating the process of applying, drying, and degreasing the piezoelectric precursor film 71 several times, for example, two times.

Further, although the piezoelectric body layer 70 is formed by the solgel method in the embodiments described above, this is not specifically limited, and the piezoelectric body layer 70 may be formed, for example, by a MOD method or sputtering.

Further, although the adhesion layer 61, the first electrode film 60, and the anti-dispersion layer 62 are used in the embodiments described above, this is not limited, and for example, it may be possible to form an anti-dispersion layer for maintaining adhesion by preventing the adhesion layer between the adhesion layer 61 and the first electrode film 60 from dispersing in the platinum layer.

Further, although an inkjet type recording head is exemplified as an example of a liquid ejecting head in the embodiments described above, the present invention is made in consideration of common wide liquid ejecting heads and may also be applied to a manufacturing method of a liquid ejecting head that injects liquid other than ink. In addition, as the liquid ejecting head, various recording heads that are used in an image recording apparatus, such as a printer, color material ejecting heads that are used for manufacturing of a color filter, such as a liquid crystal display, electrode ejecting heads that are used to form electrodes of an organic EL display, an FED (Field Emission Display), and bio organic material ejecting heads that are used for manufacturing of a bio chip may be exemplified.

Further, the present invention is not limited to a manufacturing method of a piezoelectric element that is mounted in a liquid ejecting head represented by an inkjet type recording head and may be applied to a manufacturing method of piezoelectric elements that are mounted in other apparatuses.

What is claimed is:

1. A piezoelectric element comprising:
   an electrode film; and
   a piezoelectric layer provided above the electrode film,
   wherein the electrode film is preferentially oriented with a (111) surface and contains platinum as a main component; and
   the electrode film has a rhombohedral system.

2. The piezoelectric element according to claim 1, wherein the electrode film has a crystal surface gap of 2.242 to 2.262 Å in the (111) surface of the electrode film.

3. The piezoelectric element according to claim 1, wherein the piezoelectric layer has a perovskite structure.

4. A liquid ejecting head comprising the piezoelectric element according claim 1.

5. A liquid ejecting apparatus comprising the liquid ejecting head according to claim 4.

* * * * *